US012783212B2

(12) United States Patent
Banerjee et al.

(10) Patent No.: US 12,783,212 B2
(45) Date of Patent: Nov. 3, 2026

(54) STATIC CMOS-BASED FULL ADDER CIRCUITS

(71) Applicant: Samsung Electronics Co., Ltd., Suwon-si (KR)

(72) Inventors: Debojyoti Banerjee, Bengaluru (IN); Abhishek Ghosh, Bengaluru (IN); Raghavendra Ramakant Shirodkar, Bengaluru (IN); Rakesh Dimri, Bengaluru (IN); Utkarsh Garg, Bengaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 1108 days.

(21) Appl. No.: 17/821,763

(22) Filed: Aug. 23, 2022

(65) Prior Publication Data

US 2023/0418556 A1 Dec. 28, 2023

(30) Foreign Application Priority Data

Jun. 22, 2022 (IN) ............................ 202241035669

(51) Int. Cl.

*G06F 7/501* (2006.01)
*H03K 17/687* (2006.01)
*H03K 19/20* (2006.01)

(52) U.S. Cl.

CPC ......... *G06F 7/501* (2013.01); *H03K 17/6872* (2013.01); *H03K 19/20* (2013.01)

(58) Field of Classification Search

CPC ....................................................... G06F 7/501

See application file for complete search history.

(56) References Cited

U.S. PATENT DOCUMENTS 3,986,042 A 10/1976 Padgett et al.
4,905,179 A * 2/1990 Licciardi ................ G06F 7/503 708/707

(Continued)

FOREIGN PATENT DOCUMENTS

CN 111625215 A 9/2020

OTHER PUBLICATIONS

Examination Report issued in corresponding Indian Patent Application No. 202241035669 (mailed Apr. 1, 2025).

*Primary Examiner* — Michael D. Yaary
(74) *Attorney, Agent, or Firm* — Wolf, Greenfield & Sacks, P.C.

(57) ABSTRACT

Provided is an apparatus that includes an integrated circuit including a static complementary metal-oxide-semiconductor based full adder circuit. The integrated circuit includes a carry generation circuit configured to receive a first input and a second input to generate a carry, and a carry propagation circuit configured to receive the first input, the second input, and a third input to generate a propagated output. The integrated circuit further includes a carry output generation circuit configured to receive the generated carry and the propagated output to generate a final carry as an output, and a sum generation circuit configured to generate a sum output. The sum generation circuit includes the carry generation circuit and is configured to receive the first input, the second input, and generated carry to generate an exclusive NOR output, and further uses the generated exclusive NOR output and the third input to generate the sum output.

20 Claims, 5 Drawing Sheets

(56) References Cited

U.S. PATENT DOCUMENTS

| | | | | |
|---|---|---|---|---|
| 8,161,427 | B2 | 4/2012 | Morgenshtein et al. | |
| 2016/0092170 | A1 | 3/2016 | Nandi et al. | |
| 2021/0124558 | A1* | 4/2021 | Elkin ...................... | G06F 7/501 |
| 2022/0236950 | A1* | 7/2022 | Hwang ................... | G06F 7/501 |

* cited by examiner

FIG. 1 (Prior-Art)

STATIC CMOS-BASED FULL ADDER CIRCUITS

CROSS TO REFERENCE TO RELATED APPLICATION(S)

This application claims benefit of priority to Indian Patent Application No. 202241035669 filed on Jun. 22, 2022 in the Indian Patent Office, the disclosure of which is incorporated herein by reference in its entirety.

FIELD

The present disclosure relates to high-performance digital integrated circuits.

BACKGROUND

In recent developments in system on chips (SoCs), full adders may be computationally-heavy blocks of the SoC. The various units of the SoCs that consume power are logic implementation, full adders, flip flops, RAM, clock tree, and integrated clock gating (ICG) cells. The full adders may cover most of the total area of the SoCs and consume one-third of the total power in a typical digital design.

A complementary metal-oxide-semiconductor (CMOS) based mirror full adder is one of the broadly utilized economical implementations of the full adder in CMOS technology. However, a conventional CMOS based mirror full adder may include 3 MOS stacking of PMOS and NMOS transistors in the sum generation path. As an example, FIG. 1 of the drawings illustrates a conventional CMOS based mirror full adder circuit 100. In FIG. 1, a part of the circuitry highlighted by dashed lines 104 indicates 3 MOS stacking of PMOS and NMOS transistors in the sum generation path. Also, as shown in FIG. 1, NET1 is driven by at least 2 MOS stacks and drives 4 MOS gates. Therefore, this significantly degrades the delay in most of the sum and carry output arcs. Furthermore, as shown in FIG. 1, AB input pins are connected to 8 MOS transistors (e.g., transistors 102-A through 102-H each have input pin A connected thereto) and CI input pin is connected to 6 MOS transistors, which may result in heavily loading the preceding stage.

Further, in the conventional CMOS based mirror full adder as shown in FIG. 1, a carry propagation circuit 106 and a carry generation circuit 108 are combined to form the carry out generation section CO in a single stage. This also significantly degrades the delay carry output arcs.

In general, the performance factor will be reduced in such a full adder where input pins AB are connected to 8 MOS transistors and input pin CI is connected to 6 MOS transistors.

SUMMARY

This summary is provided to introduce a selection of concepts in a simplified format that are further described in the detailed description of the invention. This summary is not intended to identify key or essential inventive concepts of the invention, nor is it intended for determining the scope of the invention.

In an implementation, the present subject matter refers to an apparatus that comprises an integrated circuit including a static CMOS-based Full Adder (FA) circuit. The static CMOS based FA circuit includes a carry generation circuit that comprises a first NAND logic circuit configured to receive a first input and a second input and to generate a carry, and a carry propagation circuit that comprises a first boolean logic circuit configured to receive the first input, the second input, and a third input and to generate a propagated output. The carry generation circuit and the carry propagation circuit are configured to collectively form a carry output generation circuit. The carry output generation circuit comprises a second NAND logic circuit configured to receive the generated carry of the first NAND logic circuit and the propagated output of the first boolean logic circuit and to generate a final carry as an output. The static CMOS based FA circuit further includes a sum generation circuit that comprises a second boolean logic circuit and an exclusive NOR logic circuit and to generate a sum output. The second boolean logic circuit includes the carry generation circuit and is configured to receive the first input, the second input, and generated carry and to generate an exclusive NOR output, and the exclusive NOR logic circuit is configured to receive the exclusive NOR output and the third input and to generate the sum output.

In another implementation, the present subject matter refers to an apparatus that comprises an integrated circuit including a static CMOS-based FA circuit. The static CMOS based FA circuit includes a carry generation circuit that comprises a first NAND logic circuit configured to receive a first input and a second input and to generate a carry, and a carry propagation circuit that comprises a first boolean logic circuit configured to receive the first input, the second input, and a third input and to generate a propagated output. The carry generation circuit and the carry propagation circuit are configured to collectively form a carry output generation circuit. The carry output generation circuit comprises a second NAND logic circuit configured to receive the generated carry of the first NAND logic circuit and the propagated output of the first boolean logic circuit and to generate a final carry as an output. The static CMOS based FA circuit further includes a sum generation circuit that comprises a second boolean logic circuit, a first inverter, a third boolean logic circuit, and a second inverter and that is configured to generate a sum output. The second boolean logic circuit includes the carry generation circuit and is configured to receive the first input, the second input, and the generated carry and to generate an exclusive NOR output. The first inverter is configured to invert the exclusive NOR output of the second boolean logic circuit and to generate an inverted exclusive NOR output. The third boolean logic circuit is configured to receive the exclusive NOR output, the inverted exclusive NOR output, the propagated output, and the third input and to generate the sum output. The second inverter is configured to invert the generated sum output.

In yet another implementation, the present subject matter describes an apparatus that comprises an integrated circuit including a static CMOS-based FA circuit. The static CMOS based FA circuit includes a carry generation circuit that comprises a first NAND logic circuit configured to receive a first input and a second input and to generate a carry, and a carry propagation circuit that comprises a first boolean logic circuit configured to receive the first input, the second input, and a third input and to generate a propagated output. The carry generation circuit and the carry propagation circuit are configured to collectively form a carry output generation circuit. The carry output generation circuit comprises a second NAND logic circuit configured to receive the generated carry of the first NAND logic circuit and the propagated output of the first boolean logic circuit and to generate a final carry as an output. The static CMOS based FA circuit further includes a sum generation circuit that comprises a second boolean logic circuit, an exclusive NOR logic circuit, and an inverter and that is configured to generate a sum output. The second boolean logic circuit includes the carry generation circuit and is configured to receive the first input, the second input, and the generated carry and to generate an exclusive NOR output. The exclusive NOR logic circuit is configured to receive the exclusive NOR output and the third input and to generate the sum output. The inverter is configured to generate an inverted sum output by inverting the sum output generated by the exclusive NOR logic circuit.

To further clarify the advantages and features of the present invention, a more particular description of the invention will be rendered by reference to specific embodiments thereof, which are illustrated in the appended drawings. It is appreciated that these drawings depict only example embodiments of the invention and are therefore not to be considered limiting of its scope. The invention will be described and explained with additional specificity and detail with the accompanying drawings.

BRIEF DESCRIPTION OF THE DRAWINGS

These and other features, aspects, and advantages of the present invention will become better understood when the following detailed description is read with reference to the accompanying drawings in which like characters represent like elements throughout the drawings, wherein.

Figure 1:
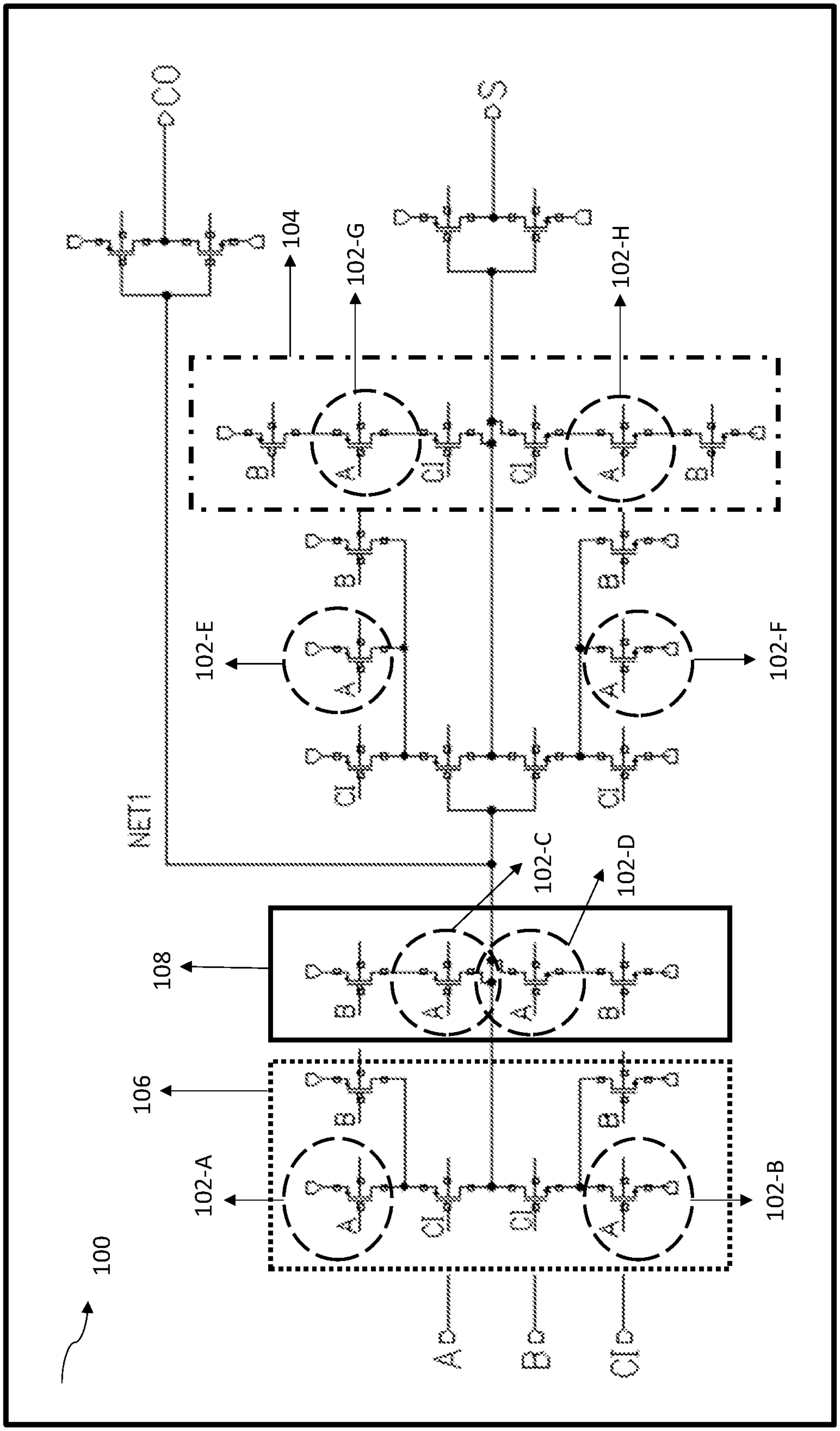
FIG. 1 illustrates a conventional CMOS based mirror full adder circuit, in accordance with a conventional state of the art.

Further, skilled artisans will appreciate that elements in the drawings are illustrated for simplicity and may not have necessarily been drawn to scale. Furthermore, in terms of the construction of the device, one or more components of the device may have been represented in the drawings by conventional symbols, and the drawings may show only those specific details that are pertinent to understanding the embodiments of the present invention so as not to obscure the drawings with details that will be readily apparent to those of ordinary skill in the art having the benefit of the description herein.

DETAILED DESCRIPTION

It should be understood at the outset that although illustrative implementations of the embodiments of the present disclosure are illustrated below, the present invention may be implemented using any number of techniques, whether currently known or in existence. The present disclosure should in no way be limited to the illustrative implementations, drawings, and techniques illustrated below, including the example designs and implementations illustrated and described herein, but may be modified within the scope of the appended claims along with their full scope of equivalents.

The term "some" as used herein is defined as "one, or more than one, or all." Accordingly, the terms "one," "more than one," "more than one, but not all" or "all" would all fall under the definition of "some." The term "some embodiments" may refer to one embodiment or to several embodiments or to all embodiments. Accordingly, the term "some embodiments" is defined as meaning "one embodiment, or more than one embodiment, or all embodiments."

The terminology and structure employed herein is for describing, teaching, and illuminating example embodiments and their specific features and elements and does not limit, restrict, or reduce the scope of the claims or their equivalents.

Moreover, any terms used herein such as but not limited to "includes," "comprises," "has," "consists," and grammatical variants thereof do not specify an exact limitation or restriction and certainly do not exclude the possible addition of one or more features or elements, unless otherwise stated, and furthermore must not be taken to exclude the possible removal of one or more of the listed features and elements, unless otherwise stated with the limiting language "must comprise" or "needs to include."

Whether or not a certain feature or element was described in singular form, it may still be referred to as "one or more features" or "one or more elements" or "at least one feature" or "at least one element." Furthermore, the use of the terms "one or more" or "at least one" feature or element do not preclude there being none of that feature or element unless otherwise specified by limiting language such as "there needs to be one or more . . . " or "one or more element is required."

Unless otherwise defined, all terms, and especially any technical and/or scientific terms, used herein may be taken to have the same meaning as commonly understood by one having ordinary skill in the art.

Embodiments of the present invention will be described below in detail with reference to the accompanying drawings.

Figure 2:
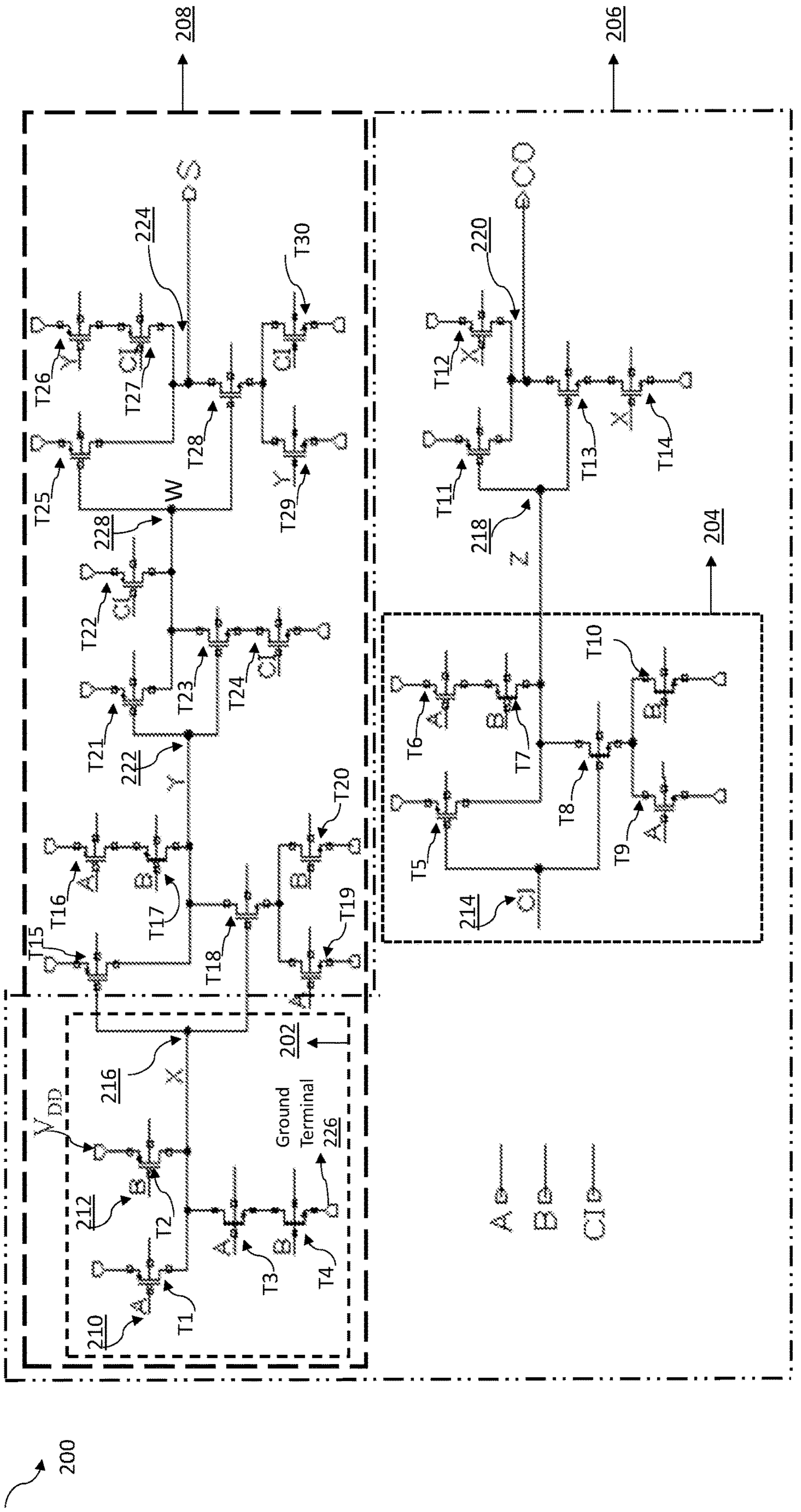
FIGS. 2-4 illustrate circuit architectures of CMOS based full adder topologies, in accordance with some embodiments of the present disclosure.

FIG. 2 illustrates a circuit architecture of CMOS based full adder topology, in accordance with some embodiments of the present disclosure. FIG. 2 depicts an integrated circuit 200 including a static complementary metal-oxide-semiconductor (CMOS) based Full Adder (FA) circuit. The static CMOS based FA circuit includes a carry generation circuit 202, a carry propagation circuit 204, a carry output generation circuit 206, and a sum generation circuit 208. The aforementioned circuit components of the integrated circuit 200 are coupled with each other. The detailed interconnection and working of each of the circuit components will be explained in the forthcoming paragraphs. Further, the reference numerals are kept the same wherever applicable for the sake of simplicity and ease of explanation.

The carry generation circuit 202 comprises a first NAND logic circuit (circuit with output Node X or 216) configured to receive a first input A 210 and a second input B 212 to generate a carry X.

The carry propagation circuit 204 comprises a first boolean logic circuit (circuit with output node Z or 218) configured to receive the first input A 210, the second input B 212, and a third input CI 214 to generate a propagated output Z. The carry generation circuit 202 and the carry propagation circuit 204 are configured to together (i.e., collectively) form the carry output generation circuit 206 as shown by dashed lines 206 in FIG. 2 of the drawings.

The carry output generation circuit 206 comprises a second NAND logic circuit (circuit with output node CO or 220) configured to receive the generated carry X of the first NAND logic circuit and the propagated output Z of the first boolean logic circuit to generate a final carry CO as an output.

The sum generation circuit 208 comprises a second boolean logic circuit (combination of the first NAND logic circuit and the circuit with output node Y) and an exclusive NOR logic circuit (circuit including output nodes W and S) to generate a sum output S (output generated at node 224). The second boolean logic circuit includes the carry generation circuit 202 and is configured to receive the first input A 210, the second input B 212, and the generated carry X to generate an exclusive NOR output Y. The exclusive NOR logic circuit is configured to receive the exclusive NOR output Y and the third input CI 214 to generate the sum output S.

The first NAND logic circuit (circuit with the output Node X 216 or 202) comprises a first PMOS transistor T1 whose gate terminal is configured to receive the first input A 210, and a second PMOS transistor T2 whose gate terminal is configured to receive the second input B 212. A source terminal of each of the first PMOS transistor T1 and the second PMOS transistor T2 is coupled to a power terminal $V_{DD}$, and a drain terminal of each of the first PMOS transistor T1 and the second PMOS transistor T2 is coupled to a first node 216.

The first NAND logic circuit further comprises a first NMOS transistor T3 whose gate terminal is configured to receive the first input A 210 and whose drain terminal is coupled to the first node 216, and a second NMOS transistor T4 whose gate terminal is configured to receive the second input B 212 and whose drain terminal is coupled to a source terminal of the first NMOS transistor T3. Further, a source terminal of the second NMOS transistor T4 is coupled to a ground terminal 226, and the first NAND logic circuit is further configured to generate the carry X at the first node 216.

The first boolean logic circuit (circuit with output node Z or 218) comprises a first PMOS transistor T5 whose gate terminal is configured to receive the third input CI 214, a second PMOS transistor T6 whose gate terminal is configured to receive the first input A 210, and a third PMOS transistor T7 whose gate terminal is configured to receive the second input B 212. A source terminal of each of the first PMOS transistor T5 and the second PMOS transistor T6 is coupled to the power terminal, and a source terminal of the third PMOS transistor T7 is coupled to a drain terminal of the second PMOS transistor T6.

The first boolean logic circuit further comprises a first NMOS transistor T8 whose gate terminal is configured to receive the third input CI 214, where a drain terminal of each of the first PMOS transistor T5, the third PMOS transistor T7, and the first NMOS transistor T8 is coupled to a second node 218. The first boolean logic circuit furthermore comprises a second NMOS transistor T9 whose gate terminal is configured to receive the first input A 210 and whose drain terminal is coupled to a source terminal of the first NMOS transistor T8. The first boolean logic circuit furthermore comprises a third NMOS transistor T10 whose gate terminal is configured to receive the second input B 212 and whose drain terminal is coupled to the source terminal of the first NMOS transistor T8. The first boolean logic circuit is further configured to generate the propagated output Z at the second node 218.

The second NAND logic circuit (circuit with output node CO or 220) comprises a first PMOS transistor T11 whose gate terminal is configured to receive the propagated output Z and a second PMOS transistor T12 whose gate terminal is configured to receive the generated carry X. A source terminal of each of the first PMOS transistor T11 and the second PMOS transistor T12 is coupled to the power terminal $V_{DD}$. The second NAND logic circuit further comprises a first NMOS transistor T13 whose gate terminal is configured to receive the propagated output Z and whose drain terminal is coupled to a drain terminal of each of the first PMOS transistor T11 and the second PMOS transistor T12 to form a third node 220. The second NAND logic circuit furthermore comprises a second NMOS transistor T14 whose gate terminal is configured to receive the generated carry X and whose source terminal is coupled to the ground terminal 226, where a drain terminal of the second NMOS transistor T14 is coupled to a source terminal of the first NMOS transistor T13 and the second NAND logic circuit is further configured to generate the final carry CO at the third node 220.

The second boolean logic circuit (combination of the first NAND logic circuit and the circuit with output node Y) comprises the first NAND logic circuit 202 as/of the carry generation circuit, a first PMOS transistor T15 whose gate terminal is configured to receive the generated carry X, a second PMOS transistor T16 whose gate terminal is configured to receive the first input A 210, and a third PMOS transistor T17 whose gate terminal is configured to receive the second input B 212. Here, a source terminal of each of the first PMOS transistor T15 and the second PMOS transistor T16 is coupled to the power terminal, and a drain terminal of each of the first PMOS transistor T15 and the third PMOS transistor T17 is coupled to a fourth node 222.

The second boolean logic circuit (combination of the first NAND logic circuit and the circuit with output node Y) further comprises a first NMOS transistor T18 whose gate terminal is configured to receive the generated carry X and whose drain terminal is coupled to drain terminals of the first PMOS transistor T15 and the third PMOS transistor T17 to form the fourth node 222. The second boolean logic circuit further comprises a second NMOS transistor T19 whose gate terminal is configured to receive the first input A 210, and a third NMOS transistor T20 whose gate terminal is configured to receive the second input B 212. Here, a source terminal of each of the second NMOS transistor T19 and the third NMOS transistor T20 terminal is coupled to the ground terminal 226, a drain terminal of each of the second NMOS transistor T19 and the third NMOS transistor T20 is coupled to a source terminal of the first NMOS transistor T18, and the second boolean logic circuit is further configured to generate the exclusive NOR output Y at the fourth node 222.

The exclusive NOR logic circuit (circuit including output nodes W and S) comprises a first PMOS transistor T21 whose gate terminal is configured to receive the exclusive NOR output Y, and a second PMOS transistor T22 whose gate terminal is configured to receive the third input CI 214, where a source terminal of each of the first PMOS transistor T21 and the second PMOS transistor T22 is coupled to the power terminal. The exclusive NOR logic circuit further comprises a first NMOS transistor T23 whose gate terminal is configured to receive the exclusive NOR output Y and whose drain terminal is coupled to drain terminals of the first PMOS transistor T21 and the second PMOS transistor T22 to form a fifth node W 228, and a second NMOS transistor T24 whose gate terminal is configured to receive the third input CI 214 and whose source terminal is coupled to the ground terminal 226.

The exclusive NOR logic circuit (circuit including output nodes W and S) furthermore comprises a third PMOS transistor T25 whose gate terminal is coupled to the fifth node 228, a fourth PMOS transistor T26 whose gate terminal is configured to receive the exclusive NOR output Y, and a fifth PMOS transistor T27 whose gate terminal is configured to receive the third input CI 214 and whose source terminal is coupled to a drain terminal of the third PMOS transistor T25. Here, a source terminal of each of the third PMOS transistor T25 and the fourth PMOS transistor T26 is coupled to the power terminal.

The exclusive NOR logic circuit furthermore comprises a third NMOS transistor T28 whose gate terminal is coupled to the fifth node 228, a fourth NMOS transistor T29 whose gate terminal is configured to receive the exclusive NOR output Y, and a fifth NMOS transistor T30 whose gate terminal is configured to receive the third input CI 214. Here, a drain terminal of the third NMOS transistor T28 is coupled to a drain terminal of each of the third PMOS transistor T25 and the fifth PMOS transistor T27 to form a sixth node 224. Further, a source terminal of each of the fourth NMOS transistor T29 and the fifth NMOS transistor T30 is coupled to the ground terminal 226. Furthermore, a drain terminal of each of the fourth NMOS transistor T29 and the fifth NMOS transistor T30 is coupled to a source terminal of the third NMOS transistor T28, and accordingly, the exclusive NOR logic circuit is further configured to generate the sum output S at the sixth node 224.

According to some embodiments of the present disclosure, as shown in FIG. 2, the integrated circuit topology 200 is structured in order to limit a maximum number of NMOS/PMOS stacks to a 2-transistor stack, whereas the conventional full adder circuit as described in FIG. 1 has a 3-transistor stack. In particular, the number of stages and fan-out of the internal nodes of the circuit have been improved/optimized and hence help in improving (e.g., reducing) the overall delay of the circuit.

Also, the input pins A and B of the integrated circuitry topology 200 are each connected to no more than (e.g., exactly/only) 6 MOS transistors and input pin CI is connected to no more than (e.g., exactly/only) 4, 5, or 6 MOS transistors, whereas the input pins A and B of the conventional full adder circuit as described in FIG. 1 are connected to 8 MOS transistors and the input pin CI of the conventional full adder circuit is connected to 6 MOS transistors. Therefore, the integrated circuit topology 200 of the present invention helps in the reduction of the input capacitance for a preceding stage of the circuit. Moreover, the integrated circuit topology 200 of the present invention helps reduce the size (e.g., total area) of the full adder circuit.

Further, the integrated circuitry topology 200 as shown in FIG. 2 is designed such that the carry generation logic is separated from the carry propagation logic. Therefore, the input to carry out delay can be reduced.

According to some embodiments of the present disclosure, the integrated circuitry topology 200 design is robust in lower voltage and is free of static 1 or static 0 hazards, thereby enhancing the performance of the CMOS circuitry.

Figure 3:
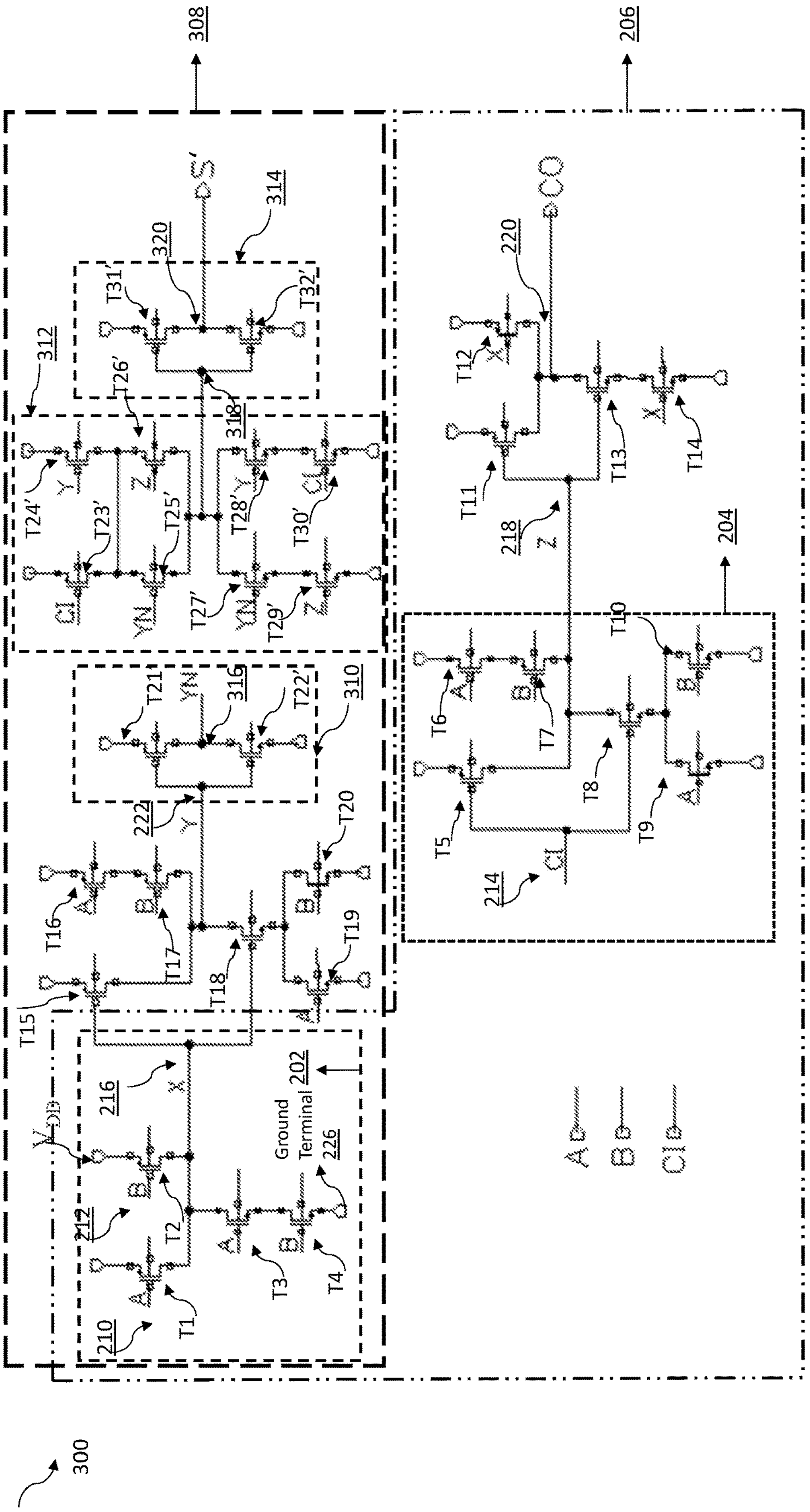

Referring now to FIG. 3 of the Drawings, FIG. 3 illustrates a circuit architecture of CMOS based full adder topology, in accordance with some embodiments of the present disclosure. FIG. 3 depicts an integrated circuit 300 including a CMOS based FA circuit. The static CMOS based FA circuit includes a carry generation circuit 202, a carry propagation circuit 204, a carry output generation circuit 206, and a sum generation circuit 308.

The carry generation circuit 202 comprises a first NAND logic circuit (circuit with output Node X or 216) configured to receive a first input A 210 and a second input B 212 to generate a carry X.

The carry propagation circuit 204 comprises a first boolean logic circuit (circuit with output node Z or 218) configured to receive the first input A 210, the second input B 212, and a third input CI 214 to generate a propagated output Z. The carry generation circuit 202 and the carry propagation circuit 204 are configured to together (i.e., collectively) form the carry output generation circuit 206 as shown by dashed lines 206 in FIGS. 2 and 3 of the drawings.

The carry output generation circuit 206 comprises a second NAND logic circuit (circuit with output node CO or 220) configured to receive the generated carry X of the first NAND logic circuit and the propagated output Z of the first boolean logic circuit to generate a final carry CO as an output.

In FIG. 3, the same reference numerals are attached to components of the circuit having an architecture the same as those of the integrated circuity 200 including the static CMOS based FA circuit of FIG. 2, and therefore a description of these components of the circuit may be omitted for the sake of brevity and the ease of explanation. This is also applicable to other embodiments described below.

The integrated circuit 300 differs from the integrated circuit 200 (FIG. 2), in that the sum generation circuit 308 of FIG. 3 is restructured in comparison to the sum generation circuit 208 of the integrated circuit 200. Therefore, only the detailed interconnection and working of the sum generation circuit 308 components may be explained in the forthcoming paragraphs.

According to some embodiments of the present disclosure, the sum generation circuit 308 comprises a second boolean logic circuit (combination of the first NAND logic circuit 202 and the circuit with output node Y), a first inverter 310, a third boolean logic circuit 312, and a second inverter 314 to generate a sum output S'.

The second boolean logic circuit includes the first NAND logic circuit 202 as/of the carry generation circuit and is configured to receive the first input A 210, the second input B 212, and the generated carry X to generate an exclusive NOR output Y.

The first inverter 310 is configured to invert the exclusive NOR output Y of the second boolean logic circuit to generate an inverted exclusive NOR output YN. The first inverter 310 comprises a PMOS transistor T21' whose gate terminal is configured to receive the exclusive NOR output Y and whose source terminal is coupled to the power terminal. The first inverter 310 further comprises an NMOS transistor T22' whose gate terminal is configured to receive the exclusive NOR output Y and whose drain terminal is coupled to a drain terminal of the PMOS transistor T21' to form a fifth node 316. The first inverter 310 generates the inverted exclusive NOR output YN at the fifth node 316.

The third boolean logic circuit 312 is configured to receive the exclusive NOR output Y, the inverted exclusive NOR output YN, the propagated output Z, and the third input CI 214 to generate the sum output S. The third boolean logic circuit 314 comprises a first PMOS transistor T23' whose gate terminal is configured to receive the third input CI 214, a second PMOS transistor T24' whose gate terminal is configured to receive the exclusive NOR output Y, a third PMOS transistor T25' whose gate terminal is configured to receive the inverted exclusive NOR output YN, and a fourth PMOS transistor T26' whose gate terminal is configured to receive the propagated output Z. Here, a source terminal of each of the first PMOS transistor T23' and the second PMOS transistor T24' is coupled to the power terminal $V_{DD}$, and a source terminal of the third PMOS transistor T25' is coupled to a drain terminal of the first PMOS transistor T23'. A source terminal of the fourth PMOS transistor T26' is coupled to a drain terminal of the second PMOS transistor T24', and a drain terminal of each of the third PMOS transistor T25' and the fourth PMOS transistor T26' is coupled to a sixth node 318.

The third boolean logic circuit 312 further comprises a first NMOS transistor T27' whose gate terminal is configured to receive the inverted exclusive NOR output YN, a second NMOS transistor T28' whose gate terminal is configured to receive the exclusive NOR output Y, a third NMOS transistor T29' whose gate terminal is configured to receive the propagated output Z, and a fourth NMOS transistor T30' whose gate terminal is configured to receive the third input CI 214. Here, drain terminals of each of the first NMOS transistor T27' and the second NMOS transistor T28' is coupled to the drain terminal of each of the third PMOS transistor T25' and the fourth PMOS transistor T26' to form the sixth node 318. A drain terminal of the third NMOS transistor T29' is coupled to a source terminal of the first NMOS transistor T27', and a drain terminal of the fourth NMOS transistor T30' is coupled to a source terminal of the second NMOS transistor T28'. Further, the drain terminal of each of the third NMOS transistor T29' and the fourth NMOS transistor T30' is coupled to the ground terminal.

The second inverter 314 is configured to invert the generated sum output and thereafter generates inverted sum output S'. The second inverter 314 comprises a fifth PMOS transistor T31' whose gate terminal is coupled to the sixth node 318 and whose source terminal is coupled to the power terminal. The second inverter 314 further comprises a fifth NMOS transistor T32' whose gate terminal is coupled to the sixth node 318. Here, a drain terminal of the fifth PMOS transistor T31' is coupled with a drain terminal of the fifth NMOS transistor T32' to form a seventh node 320. A source terminal of the fifth NMOS transistor T32' is coupled to the ground terminal and the inverted sum output S' is generated at the seventh node 320.

According to some embodiments of the present disclosure, as shown in FIG. 3, the integrated circuitry topology 300 is structured in order to limit the maximum number of NMOS/PMOS stacks to a 2-transistor stack. Whereas the conventional full adder circuit as described in FIG. 1 has a 3-transistor stack. In particular, the number of stages and fan-out of the internal nodes of the circuit have been improved/optimized and hence help in improving the overall delay of the circuit.

Also, the input pins A and B of the integrated circuitry topology 300 are only connected to 6 MOS transistors and input pin CI is connected to only 4 MOS transistors, whereas the input pins A and B of the conventional full adder circuit as described in FIG. 1 are connected to 8 MOS transistors and the input pin CI of the conventional full adder circuit is connected to 6 MOS transistors. Therefore, the integrated circuit topology 300 of the present invention helps in the reduction of the input capacitance for a preceding stage of the circuit.

Further, the integrated circuitry topology 300 as shown in FIG. 3 is designed such that the carry generation logic is separated from the carry propagation logic. Therefore, the carry out may be faster, and thereafter the input to carry out delay can be reduced.

According to some embodiments of the present disclosure, the integrated circuitry topology 300 design is robust in lower voltage and is free of static 1 or static 0 hazards, thereby enhancing the performance of the overall CMOS circuitry.

Figure 4:
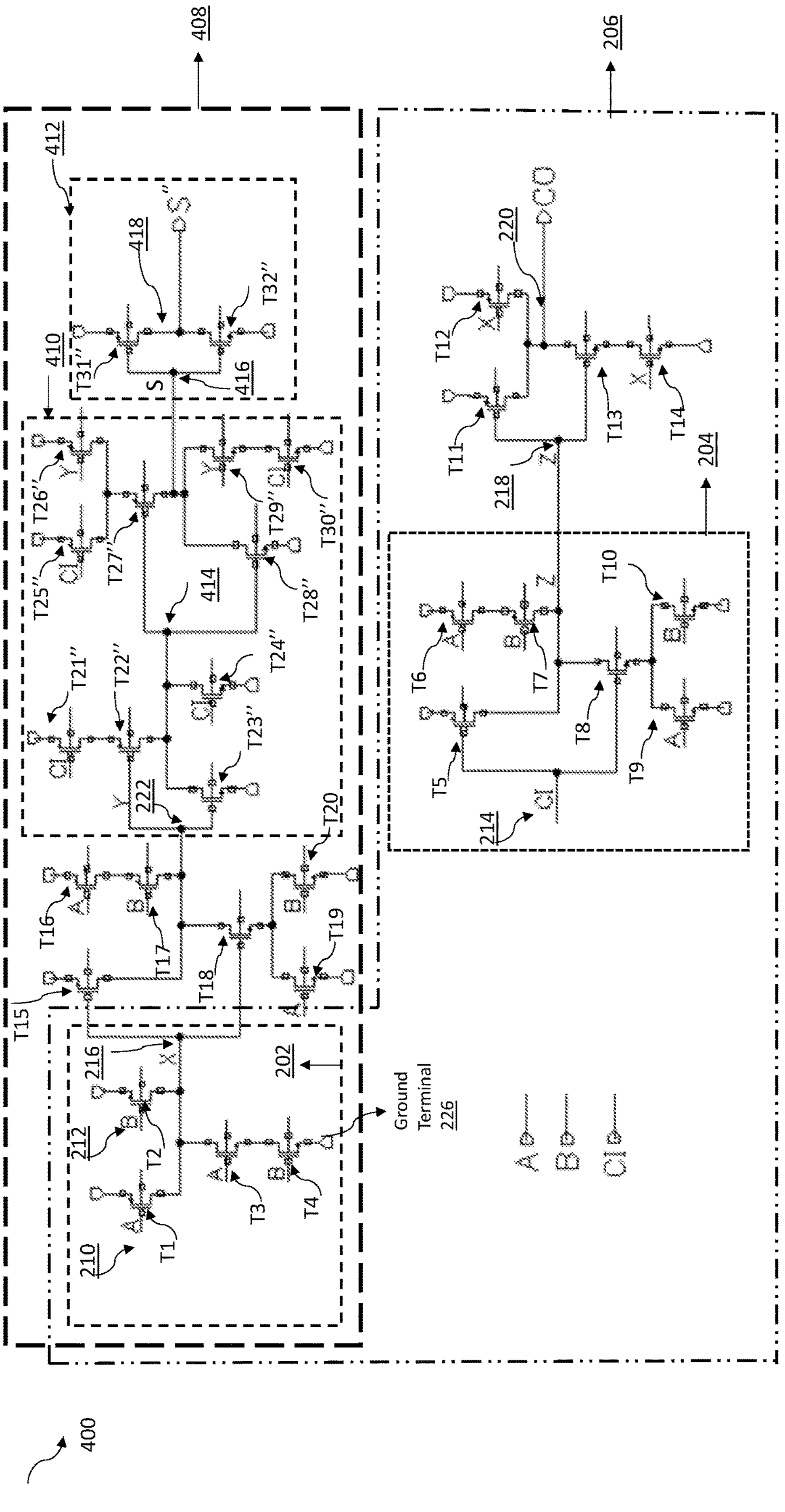

Referring now to FIG. 4 of the Drawings, FIG. 4 illustrates a circuit architecture of CMOS based full adder topology, in accordance with some embodiments of the present disclosure. FIG. 4 depicts an integrated circuit 400 including CMOS based FA circuit. The static CMOS based FA circuit includes a carry generation circuit 202, a carry propagation circuit 204, a carry output generation circuit 206, and a sum generation circuit 408.

The carry generation circuit 202 comprises a first NAND logic circuit (circuit with output Node X or 216) configured to receive a first input A 210 and a second input B 212 to generate a carry X.

The carry propagation circuit 204 comprises a first boolean logic circuit (circuit with output node Z or 218) configured to receive the first input A 210, the second input B 212, and a third input CI 214 to generate a propagated output Z. The carry generation circuit 202 and the carry propagation circuit 204 are configured to together (i.e., collectively) form the carry output generation circuit 206 as shown by dashed lines 206 in FIGS. 2-4 of the drawings.

The carry output generation circuit 206 comprises a second NAND logic circuit (circuit with output node CO or 220) configured to receive the generated carry X of the first NAND logic circuit and the propagated output Z of the first boolean logic circuit to generate a final carry CO as an output.

In FIG. 4, the same reference numerals are attached to components of the circuit having an architecture the same as those of the integrated circuity 200 including the static CMOS based FA circuit of FIG. 2, and therefore a description of these components of the circuit may be omitted for the sake of brevity and the ease of explanation.

The integrated circuit 400 differs from the integrated circuit 200 (FIG. 2), in that the sum generation circuit 408 of FIG. 4 is restructured in comparison to the sum generation circuit 208 (FIG. 2). Therefore, only the detailed interconnection and working of the sum generation circuit 408 components may be explained in the forthcoming paragraphs.

According to some embodiments of the present disclosure, the sum generation circuit 408 comprises a second boolean logic circuit (combination of the first NAND logic circuit 202 and the circuit with output node Y), an exclusive NOR logic circuit 410, and an inverter 412 to generate a sum output S".

The second boolean logic circuit includes the first NAND logic circuit 202 as/of the carry generation circuit and is configured to receive the first input A 210, the second input B 212, and the generated carry X to generate an exclusive NOR output Y. Further, the second boolean logic circuit of the integrated circuit 400 is same as the second boolean logic circuit of the integrated circuit 200. Therefore, a description of the second boolean logic circuit of the integrated circuit 400 may be omitted herein for the sake of simplicity and ease of explanation.

The exclusive NOR logic circuit 410 is configured to receive the exclusive NOR output Y and the third input CI 214 to generate the sum output S. The exclusive NOR logic circuit 410 comprises a first PMOS transistor T21" whose gate terminal is configured to receive the third input CI 214, a second PMOS transistor T22" whose gate terminal is configured to receive exclusive NOR output Y, a first NMOS transistor T23" whose gate terminal is configured to receive the exclusive NOR output Y, and a second NMOS transistor T24" whose gate terminal is configured to receive the third input CI 214. Here, a source terminal of the first PMOS transistor T21" is coupled to the power terminal, and a source terminal of the second PMOS transistor T22" is coupled to a drain terminal of the first PMOS transistor T21". Further, a drain terminal of each of the first NMOS transistor T23" and the second NMOS transistor T24" is coupled to a drain terminal of the second PMOS transistor T22" to form a node 414. Furthermore, a source terminal of each of the first NMOS transistor T23" and the second NMOS transistor T24" is coupled to the ground terminal 226.

The exclusive NOR logic circuit 410 further comprises a third PMOS transistor T25" whose gate terminal is configured to receive the third input CI 214, a fourth PMOS transistor T26" whose gate terminal is configured to receive the exclusive NOR output Y, and a fifth PMOS transistor T27" whose gate terminal is coupled to the node 414. Here, a source terminal of each of the third PMOS transistor T25" and the fourth PMOS transistor T26" is coupled to the power terminal, and a source terminal of the fifth PMOS transistor T27" is coupled to drain terminals of the third PMOS transistor T25" and the fourth PMOS transistor T26". The exclusive NOR logic circuit 410 furthermore comprises a third NMOS transistor T28" whose gate terminal is coupled to the node 414 and whose drain terminal is coupled to another node 416, a fourth NMOS transistor T29" whose gate terminal is configured to receive the exclusive NOR output Y, and a fifth NMOS transistor T30" whose gate terminal is configured to receive the third input CI 214. Here, a drain terminal of each of the third NMOS transistor T28" and the fourth NMOS transistor T29" is coupled to the drain terminal of the fifth PMOS transistor T30" to form the node 416. Further, a source terminal of each of the third NMOS transistor T28" and the fifth NMOS transistor T30" is coupled to the ground terminal. Furthermore, a drain terminal of the fifth NMOS transistor T30" is coupled to a source terminal of the fourth NMOS transistor T29".

The inverter 412 is configured to invert the sum output generated by the exclusive NOR logic circuit to generate an inverted sum output S". The inverter 412 comprises a sixth PMOS transistor T31" whose gate terminal is coupled to the node 416 and whose source terminal is coupled to the power terminal. The inverter 412 further comprises a sixth NMOS transistor T32" whose gate terminal is coupled to the node 416 and whose source terminal is coupled to the ground terminal. Here, a drain terminal of the sixth NMOS transistor T32" is coupled to a drain terminal of the sixth PMOS transistor T31" to form a sum node 418. Further, the inverted sum output S" is generated at the sum node 418.

According to some embodiments of the present disclosure, as shown in FIG. 4, the integrated circuitry topology 400 is structured in order to limit the maximum number of NMOS/PMOS stacks to a 2-transistor stack. Whereas the conventional full adder circuit as described in FIG. 1 has a 3-transistor stack. In particular, the number of stages and fan-out of the internal nodes of the circuit have been improved/optimized and hence help in improving the overall delay of the circuit.

Also, the input pins A and B of the integrated circuitry topology 400 are only connected to 6 MOS transistors, whereas the input pins A and B of the conventional full adder circuit as described in FIG. 1 are connected to 8 MOS transistors. Therefore, the integrated circuit topology 400 of the present invention helps in the reduction of the input capacitance for a preceding stage of the circuit.

Further, the integrated circuitry topology 400 as shown in FIG. 4 is designed such that the carry generation logic is separated from the carry propagation logic. Therefore, the carry out may be faster, and thereafter the input to carry out delay can be reduced.

According to some embodiments of the present disclosure, the integrated circuitry topology 400 design is robust in lower voltage and is free of static 1 or static 0 hazards, thereby enhancing the performance of the overall CMOS circuitry.

Furthermore, according to some embodiments of the present disclosure, the inverter 412 is added to the output of the sum generation circuit to get better rise and fall transition time. Therefore, the overall performance of the circuit will be improved.

Figure 5:
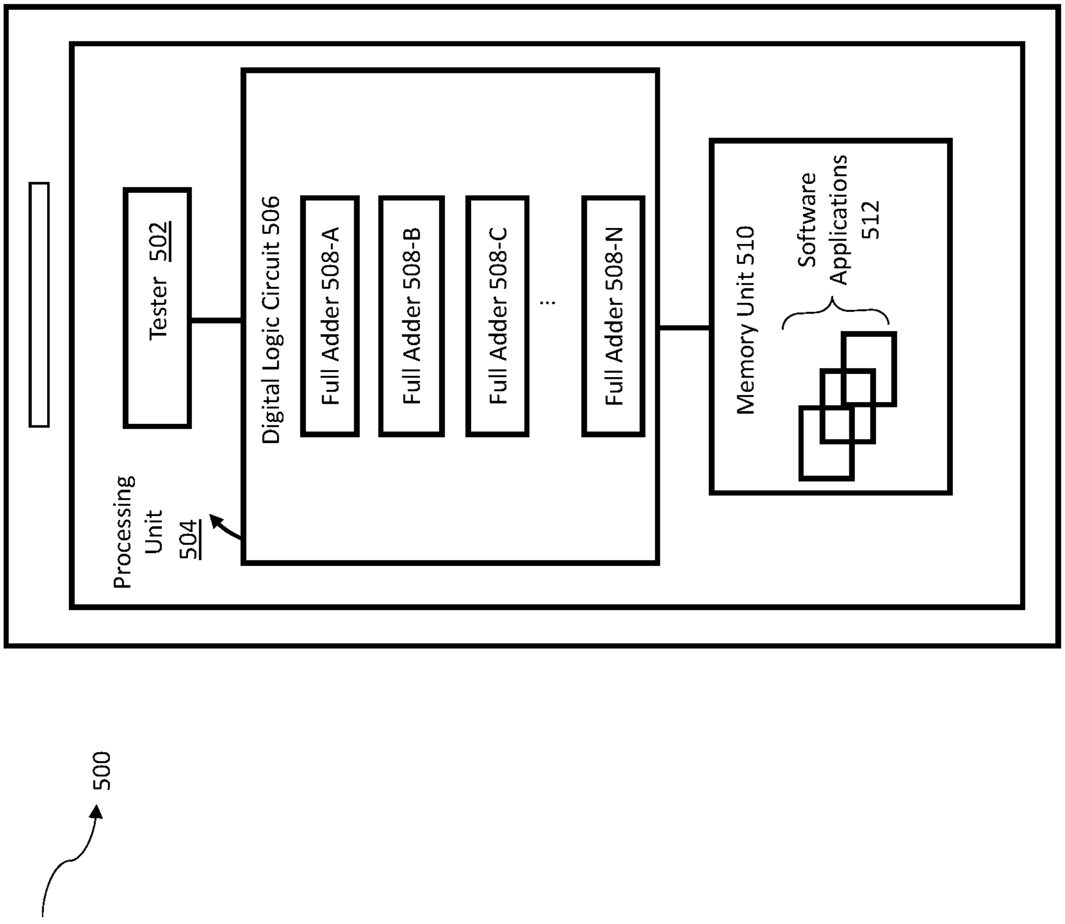
FIG. 5 illustrates a computing system, in accordance with some embodiments of the present invention.

Referring now to FIG. 5, FIG. 5 illustrates a computing system 500, in accordance with some embodiments of the present invention. The integrated circuit 200, 300, or 400 may be implemented in the computing system 500, according to some example embodiments of the present disclosure. The computing system 500 is, or is incorporated into but not limited to, a smartphone, a personal digital assistant, a personal computer, smartwatches, fitness trackers, a palmtop computer, a laptop computer, a desktop computer, a communications device, a wireless telephone, a land-line telephone, a web appliance, a network router, switch or bridge, or any other machine capable of executing a set of instructions (sequential or otherwise) that specify actions to be taken by that machine or any other type of electronic system. Further, while a single computing system 500 is illustrated, the term “system” shall also be taken to include any collection of systems or sub-systems that individually or jointly execute a set, or multiple sets, of instructions to perform one or more computer functions.

In some embodiments, the computing system 500 comprises a tester 502, a megacell, or a system-on-chip (SoC) which includes control logic such as a processing unit 504 (Central Processing Unit), a Digital Logic Circuit 506 including a plurality of full adders (508-A through 508-N), a memory unit 510 (e.g., random access memory (RAM).

The processing unit 504 can be, for example, a CISC-type (Complex Instruction Set Computer) CPU, RISC-type CPU (Reduced Instruction Set Computer), a digital signal processor (DSP), or a graphics processing unit (GPU). The processing unit 504 may be a component in a variety of systems. For example, the processing unit 504 may be part of a standard personal computer or a workstation. The processing unit 504 may be one or more general processors, digital signal processors, application-specific integrated circuits, field-programmable gate arrays, servers, networks, digital circuits, analog circuits, combinations thereof, or other now known or later developed devices for analyzing and processing data. The processing unit 504 may implement a software program, such as code generated manually (i.e., programmed).

The memory unit 510 (which can be memory such as RAM, flash memory, or disk storage) stores one or more software applications 512 (e.g., embedded applications) that, when executed by the processing unit 504, perform any suitable function associated with the computing system 500. The memory unit 510 may include but is not limited to computer-readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like.

The tester 502 comprises logic that supports testing and debugging of the computing system 500 executing the software applications 512. For example, the tester 502 can be used to emulate a defective or unavailable component(s) of the computing system 500 to allow verification of how the component(s), that was present on the computing system 500 and would perform in various situations (e.g., how the component(s) would interact with the software applications 512). In this way, the software applications 512 can be debugged in an environment that resembles a post-production operation.

The Digital Logic Circuit 506 is used during the execution of the software applications 512. At least one full adder of the plurality of full adders (508-A through 508-N) includes, or is similar to, the full adder circuitry shown in FIG. 2, 3, or 4 in connection and operation.

Further, in any of the above-mentioned embodiments, the integrated circuits 200, 300, or 400 of the present disclosure have lower average delay and relative delay at a cell level in comparison to the conventional full adder. Further, also at the block level, the data arrival time in case of any of the integrated circuits 200, 300, or 400 is earlier/lower than that of the conventional full adder.

In the foregoing discussion, the term "connected" means at least either a direct electrical connection between the devices connected or an indirect connection through one or more passive intermediary devices. The term "circuit" means at least either a single component or a multiplicity of passive components, that are connected together to provide a desired function. Also, the terms "coupled to" or "couples with" (and the like) are intended to describe either an indirect or direct electrical connection. Thus, as an example, if an electronic device is coupled to another electronic device, that connection can be through a direct electrical connection, or through an indirect electrical connection via other devices and connections.

While specific language has been used to describe the disclosure, any limitations arising on account of the same are not intended. As would be apparent to a person in the art, various working modifications may be made to implement the inventive concept as taught herein.

The drawings and the forgoing description give examples of embodiments. Those skilled in the art will appreciate that one or more of the described elements may be combined into a single functional element. Alternatively, certain elements may be split into multiple functional elements. Elements from one embodiment may be added to another embodiment.

Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

Benefits, other advantages, and solutions to problems have been described above with regard to specific example embodiments. However, the benefits, advantages, solutions to problems, and any component(s) that may cause any benefit, advantage, or solution to occur or become more pronounced are not to be construed as a critical, required, or essential feature or component of any or all the claims.

That which is claimed is:

1. An apparatus comprising:

an integrated circuit including a static complementary metal-oxide-semiconductor (CMOS) based Full Adder (FA) circuit, wherein the static CMOS based FA circuit includes:

a carry generation circuit that comprises a first NAND logic circuit configured to receive a first input and a second input and to generate a carry; and a carry propagation circuit that comprises a first boolean logic circuit configured to receive the first input, the second input, and a third input and to generate a propagated output, wherein the carry generation circuit and the carry propagation circuit are configured to collectively form a carry output generation circuit, wherein the carry output generation circuit comprises a second NAND logic circuit configured to receive the generated carry of the first NAND logic circuit and the propagated output of the first boolean logic circuit and to generate a final carry as an output, wherein the static CMOS based FA circuit further includes a sum generation circuit that comprises a second boolean logic circuit and an exclusive NOR logic circuit and that is configured to generate a sum output, wherein the second boolean logic circuit includes the carry generation circuit and is configured to receive the first input, the second input, and the generated carry and to generate an exclusive NOR output, and wherein the exclusive NOR logic circuit is configured to receive the exclusive NOR output and the third input and to generate the sum output.

2. The apparatus as claimed in claim 1, wherein the first NAND logic circuit comprises:

a first PMOS transistor whose gate terminal is configured to receive the first input; and a second PMOS transistor whose gate terminal is configured to receive the second input, wherein a source terminal of each of the first PMOS transistor and the second PMOS transistor is coupled to a power terminal, wherein a drain terminal of each of the first PMOS transistor and the second PMOS transistor is coupled to a node, wherein the first NAND logic circuit further comprises:

a first NMOS transistor whose gate terminal is configured to receive the first input and whose drain terminal is coupled to the node; and a second NMOS transistor whose gate terminal is configured to receive the second input and whose drain terminal is coupled to a source terminal of the first NMOS transistor, wherein a source terminal of the second NMOS transistor is coupled to a ground terminal, and wherein the first NAND logic circuit is further configured to generate the carry at the node.

3. The apparatus as claimed in claim 1, wherein the first boolean logic circuit comprises:

a first PMOS transistor whose gate terminal is configured to receive the third input; and a second PMOS transistor whose gate terminal is configured to receive the first input, wherein a source terminal of each of the first PMOS transistor and the second PMOS transistor is coupled to a power terminal, wherein the first boolean logic circuit further comprises:

a third PMOS transistor whose gate terminal is configured to receive the second input and whose source terminal is coupled to a drain terminal of the second PMOS transistor; and a first NMOS transistor whose gate terminal is configured to receive the third input, wherein a drain terminal of each of the first PMOS transistor, the third PMOS transistor, and the first NMOS transistor is coupled to a node, wherein the first boolean logic circuit further comprises:

a second NMOS transistor whose gate terminal is configured to receive the first input and whose drain terminal is coupled to a source terminal of the first NMOS transistor; and a third NMOS transistor whose gate terminal is configured to receive the second input and whose drain terminal is coupled to the source terminal of the first NMOS transistor, and wherein the first boolean logic circuit is further configured to generate the propagated output at the node.

4. The apparatus as claimed in claim 1, wherein the second NAND logic circuit comprises:

a first PMOS transistor whose gate terminal is configured to receive the propagated output; and a second PMOS transistor whose gate terminal is configured to receive the generated carry, wherein a source terminal of each of the first PMOS transistor and the second PMOS transistor is coupled to a power terminal, wherein the second NAND logic circuit further comprises:

a first NMOS transistor whose gate terminal is configured to receive the propagated output and whose drain terminal is coupled to a drain terminal of each of the first PMOS transistor and the second PMOS transistor to form a node; and a second NMOS transistor whose gate terminal is configured to receive the generated carry and whose source terminal is coupled to a ground terminal, wherein a drain terminal of the second NMOS transistor is coupled to a source terminal of the first NMOS transistor, and wherein the second NAND logic circuit is further configured to generate the final carry at the node.

5. The apparatus as claimed in claim 1, wherein the second boolean logic circuit comprises:

the first NAND logic circuit of the carry generation circuit;

a first PMOS transistor whose gate terminal is configured to receive the generated carry; and a second PMOS transistor whose gate terminal is configured to receive the first input, wherein a source terminal of each of the first PMOS transistor and the second PMOS transistor is coupled to a power terminal, wherein the second boolean logic circuit further comprises a third PMOS transistor whose gate terminal is configured to receive the second input, wherein a drain terminal of each of the first PMOS transistor and the third PMOS transistor is coupled to a node, wherein the second boolean logic circuit further comprises:

a first NMOS transistor whose gate terminal is configured to receive the generated carry and whose drain terminal is coupled to drain terminals of the first PMOS transistor and the third PMOS transistor to form the node;

a second NMOS transistor whose gate terminal is configured to receive the first input; and a third NMOS transistor whose gate terminal is configured to receive the second input, wherein a source terminal of each of the second NMOS transistor and the third NMOS transistor is coupled to a ground terminal, wherein a drain terminal of each of the second NMOS transistor and the third NMOS transistor is coupled to a source terminal of the first NMOS transistor, and wherein the second boolean logic circuit is further configured to generate the exclusive NOR output at the node.

6. The apparatus as claimed in claim 1, wherein the exclusive NOR logic circuit comprises:

a first PMOS transistor whose gate terminal is configured to receive the exclusive NOR output; and a second PMOS transistor whose gate terminal is configured to receive the third input, wherein a source terminal of each of the first PMOS transistor and the second PMOS transistor is coupled to a power terminal, and wherein the exclusive NOR logic circuit further comprises:

a first NMOS transistor whose gate terminal is configured to receive the exclusive NOR output and whose drain terminal is coupled to drain terminals of the first PMOS transistor and the second PMOS transistor to form a node; and a second NMOS transistor whose gate terminal is configured to receive the third input and whose source terminal is coupled to a ground terminal.

7. The apparatus as claimed in claim 6, wherein the exclusive NOR logic circuit further comprises:

a third PMOS transistor whose gate terminal is coupled to the node; and a fourth PMOS transistor whose gate terminal is configured to receive the exclusive NOR output, wherein a source terminal of each of the third PMOS transistor and the fourth PMOS transistor is coupled to the power terminal, wherein the exclusive NOR logic circuit further comprises:

a fifth PMOS transistor whose gate terminal is configured to receive the third input and whose source terminal is coupled to a drain terminal of the third PMOS transistor;

a third NMOS transistor whose gate terminal is coupled to the node and whose drain terminal is coupled to a drain terminal of each of the third PMOS transistor and the fifth PMOS transistor to form another node;

a fourth NMOS transistor whose gate terminal is configured to receive the exclusive NOR output; and a fifth NMOS transistor whose gate terminal is configured to receive the third input, wherein a source terminal of each of the fourth NMOS transistor and the fifth NMOS transistor is coupled to the ground terminal, wherein a drain terminal of each of the fourth NMOS transistor and the fifth NMOS transistor is coupled to a source terminal of the third NMOS transistor, and wherein the exclusive NOR logic circuit is further configured to generate the sum output at the other node.

8. The apparatus as claimed in claim 1, wherein the static CMOS based FA circuit further includes:

no more than 6 MOS transistors that are configured to receive the first input; and no more than 6 MOS transistors that are configured to receive the second input.

9. An apparatus comprising:

an integrated circuit including a static complementary metal-oxide-semiconductor (CMOS) based Full Adder (FA) circuit, wherein the static CMOS based FA circuit includes:

a carry generation circuit that comprises a first NAND logic circuit configured to receive a first input and a second input and to generate a carry;

a carry propagation circuit that comprises a first boolean logic circuit configured to receive the first input, the second input, and a third input and to generate a propagated output; and a carry output generation circuit that comprises a second NAND logic circuit configured to receive the generated carry of the first NAND logic circuit and the propagated output of the first boolean logic circuit and to generate a final carry as an output, wherein the carry generation circuit and the carry propagation circuit are configured to collectively form the carry output generation circuit, wherein the static CMOS based FA circuit further includes a sum generation circuit that comprises a second boolean logic circuit, a first inverter, a third boolean logic circuit, and a second inverter and that is configured to generate a sum output, wherein the second boolean logic circuit includes the carry generation circuit and is configured to receive the first input, the second input, and the generated carry and to generate an exclusive NOR output, wherein the first inverter is configured to invert the exclusive NOR output of the second boolean logic circuit and to generate an inverted exclusive NOR output, wherein the third boolean logic circuit is configured to receive the exclusive NOR output, the inverted exclusive NOR output, the propagated output, and the third input and to generate the sum output, and wherein the second inverter is configured to invert the generated sum output.

10. The apparatus as claimed in claim 9, wherein the first NAND logic circuit comprises:

a first PMOS transistor whose gate terminal is configured to receive the first input; and a second PMOS transistor whose gate terminal is configured to receive the second input, wherein a source terminal of each of the first PMOS transistor and the second PMOS transistor is coupled to a power terminal, wherein a drain terminal of each of the first PMOS transistor and the second PMOS transistor is coupled to a node;

wherein the first NAND logic circuit further comprises:

a first NMOS transistor whose gate terminal is configured to receive the first input and whose drain terminal is coupled to the node; and a second NMOS transistor whose gate terminal is configured to receive the second input and whose drain terminal is coupled to a source terminal of the first NMOS transistor, wherein a source terminal of the second NMOS transistor is coupled to a ground terminal, and wherein the first NAND logic circuit is further configured to generate the carry at the node.

11. The apparatus as claimed in claim 9, wherein the first boolean logic circuit comprises:

a first PMOS transistor whose gate terminal is configured to receive the third input; and a second PMOS transistor whose gate terminal is configured to receive the first input, wherein a source terminal of each of the first PMOS transistor and the second PMOS transistor is coupled to a power terminal;

wherein the first boolean logic circuit further comprises:

a third PMOS transistor whose gate terminal is configured to receive the second input and whose source terminal is coupled to a drain terminal of the second PMOS transistor; and a first NMOS transistor whose gate terminal is configured to receive the third input, wherein a drain terminal of each of the first PMOS transistor, the third PMOS transistor, and the first NMOS transistor is coupled to a node, wherein the first boolean logic circuit further comprises:

a second NMOS transistor whose gate terminal is configured to receive the first input and whose drain terminal is coupled to a source terminal of the first NMOS transistor; and a third NMOS transistor whose gate terminal is configured to receive the second input and whose drain terminal is coupled to the source terminal of the first NMOS transistor, and wherein the first boolean logic circuit is further configured to generate the propagated output at the node.

12. The apparatus as claimed in claim 9, wherein the second NAND logic circuit comprises:

a first PMOS transistor whose gate terminal is configured to receive the propagated output; and a second PMOS transistor whose gate terminal is configured to receive the generated carry, wherein a source terminal of each of the first PMOS transistor and the second PMOS transistor is coupled to a power terminal, wherein the second NAND logic circuit further comprises:

a first NMOS transistor whose gate terminal is configured to receive the propagated output and whose drain terminal is coupled to a drain terminal of each of the first PMOS transistor and the second PMOS transistor to form a node; and a second NMOS transistor whose gate terminal is configured to receive the generated carry and whose source terminal is coupled to a ground terminal, wherein a drain terminal of the second NMOS transistor is coupled to a source terminal of the first NMOS transistor, and wherein the second NAND logic circuit is further configured to generate the final carry at the node.

13. The apparatus as claimed in claim 9, wherein the second boolean logic circuit comprises:

the first NAND logic circuit of the carry generation circuit;

a first PMOS transistor whose gate terminal is configured to receive the generated carry; and a second PMOS transistor whose gate terminal is configured to receive the first input, wherein a source terminal of each of the first PMOS transistor and the second PMOS transistor is coupled to a power terminal, wherein the second boolean logic circuit further comprises a third PMOS transistor whose gate terminal is configured to receive the second input, wherein a drain terminal of each of the first PMOS transistor and the third PMOS transistor is coupled to a node, wherein the second boolean logic circuit further comprises:

a first NMOS transistor whose gate terminal is configured to receive the generated carry and whose drain terminal is coupled to drain terminals of the first PMOS transistor and the third PMOS transistor to form the node;

a second NMOS transistor whose gate terminal is configured to receive the first input; and a third NMOS transistor whose gate terminal is configured to receive the second input, wherein a source terminal of each of the second NMOS transistor and the third NMOS transistor is coupled to a ground terminal, wherein a drain terminal of each of the second NMOS transistor and the third NMOS transistor is coupled to a source terminal of the first NMOS transistor, and wherein the second boolean logic circuit is further configured to generate the exclusive NOR output at the node.

14. The apparatus as claimed in claim 9, wherein the first inverter comprises:

a PMOS transistor whose gate terminal is configured to receive the exclusive NOR output and whose source terminal is coupled to a power terminal; and an NMOS transistor whose gate terminal is configured to receive the exclusive NOR output and whose drain terminal is coupled to a drain terminal of the PMOS transistor to form a node, and wherein the first inverter is configured to generate the inverted exclusive NOR output at the node.

15. The apparatus as claimed in claim 9, wherein the third boolean logic circuit comprises:

a first PMOS transistor whose gate terminal is configured to receive the third input; and a second PMOS transistor whose gate terminal is configured to receive the exclusive NOR output, wherein a source terminal of each of the first PMOS transistor and the second PMOS transistor is coupled to a power terminal, wherein the third boolean logic circuit further comprises:

a third PMOS transistor whose gate terminal is configured to receive the inverted exclusive NOR output and whose source terminal is coupled to a drain terminal of the first PMOS transistor; and a fourth PMOS transistor whose gate terminal is configured to receive the propagated output and whose source terminal is coupled to a drain terminal of the second PMOS transistor, wherein a drain terminal of each of the third PMOS transistor and the fourth PMOS transistor is coupled to a node, and wherein the second inverter comprises a fifth PMOS transistor whose gate terminal is coupled to the node and whose source terminal is coupled to the power terminal.

16. The apparatus as claimed in claim 15, wherein the third boolean logic circuit further comprises:

a first NMOS transistor whose gate terminal is configured to receive the inverted exclusive NOR output; and a second NMOS transistor whose gate terminal is configured to receive the exclusive NOR output, wherein a drain terminal of each of the first NMOS transistor and the second NMOS transistor is coupled to the drain terminal of each of the third PMOS transistor and the fourth PMOS transistor to form the node, wherein the third boolean logic circuit further comprises:

a third NMOS transistor whose gate terminal is configured to receive the propagated output and whose drain terminal is coupled to a source terminal of the first NMOS transistor; and a fourth NMOS transistor whose gate terminal is configured to receive the third input and whose drain terminal is coupled to a source terminal of the second NMOS transistor, wherein the drain terminal of each of the third NMOS transistor and the fourth NMOS transistor is coupled to a ground terminal, wherein the second inverter further comprises a fifth NMOS transistor whose gate terminal is coupled to the node, wherein a drain terminal of the fifth PMOS transistor is coupled with a drain terminal of the fifth NMOS transistor to form another node, wherein a source terminal of the fifth NMOS transistor is coupled to the ground terminal, and wherein the inverted generated sum output is generated at the other node.

17. An apparatus comprising:

an integrated circuit including a static complementary metal-oxide-semiconductor (CMOS) based Full Adder (FA) circuit, wherein the static CMOS based FA circuit includes:

a carry generation circuit that comprises a first NAND logic circuit configured to receive a first input and a second input and to generate a carry;

a carry propagation circuit that comprises a first boolean logic circuit configured to receive the first input, the second input, and a third input and to generate a propagated output; and a carry output generation circuit that comprises a second NAND logic circuit configured to receive the generated carry of the first NAND logic circuit and the propagated output of the first boolean logic circuit and to generate a final carry as an output, wherein the carry generation circuit and the carry propagation circuit are configured to collectively form the carry output generation circuit, wherein the static CMOS based FA circuit further includes a sum generation circuit that comprises a second boolean logic circuit, an exclusive NOR logic circuit, and an inverter and that is configured to generate a sum output, wherein the second boolean logic circuit includes the carry generation circuit and is configured to receive the first input, the second input, and the generated carry and to generate an exclusive NOR output, wherein the exclusive NOR logic circuit is configured to receive the exclusive NOR output and the third input and to generate the sum output, and wherein the inverter is configured to generate an inverted sum output by inverting the sum output generated by the exclusive NOR logic circuit.

18. The apparatus as claimed in claim 17, wherein the exclusive NOR logic circuit comprises:

a first PMOS transistor whose gate terminal is configured to receive the third input and whose source terminal is coupled to a power terminal;

a second PMOS transistor whose gate terminal is configured to receive exclusive NOR output and whose source terminal is coupled to a drain terminal of the first PMOS transistor;

a first NMOS transistor whose gate terminal is configured to receive the exclusive NOR output; and a second NMOS transistor whose gate terminal is configured to receive the third input, wherein a drain terminal of each of the first NMOS transistor and the second NMOS transistor is coupled to a drain terminal of the second PMOS transistor to form a first node, and wherein a source terminal of each of the first NMOS transistor and the second NMOS transistor is coupled to a ground terminal.

19. The apparatus as claimed in claim 18, wherein the exclusive NOR logic circuit further comprises:

a third PMOS transistor whose gate terminal is configured to receive the third input; and a fourth PMOS transistor whose gate terminal is configured to receive the exclusive NOR output, wherein a source terminal of each of the third PMOS transistor and the fourth PMOS transistor is coupled to the power terminal, wherein the exclusive NOR logic circuit further comprises:

a fifth PMOS transistor whose gate terminal is coupled to the first node and whose source terminal is coupled to drain terminals of the third PMOS transistor and the fourth PMOS transistor;

a third NMOS transistor whose gate terminal is coupled to the first node and whose drain terminal is coupled to a second node; and a fourth NMOS transistor whose gate terminal is configured to receive the exclusive NOR output, wherein a drain terminal of each of the third NMOS transistor and the fourth NMOS transistor is coupled to the drain terminal of the fifth PMOS transistor to form a second node, wherein the exclusive NOR logic circuit further comprises a fifth NMOS transistor whose gate terminal is configured to receive the third input, wherein a source terminal of each of the third NMOS transistor and the fifth NMOS transistor is coupled to the ground terminal, and wherein a drain terminal of the fifth NMOS transistor is coupled to a source terminal of the fourth NMOS transistor.

20. The apparatus as claimed in claim 19, wherein the inverter comprises:

a sixth PMOS transistor whose gate terminal is coupled to the second node and whose source terminal is coupled to the power terminal; and a sixth NMOS transistor whose gate terminal is coupled to the second node and whose source terminal is coupled to the ground terminal, wherein a drain terminal of the sixth NMOS transistor is coupled to a drain terminal of the sixth PMOS transistor to form a sum node, and wherein the inverted sum output is generated at the sum node.

* * * * *